United States Patent
Tolmachev et al.

(10) Patent No.: US 7,404,879 B2
(45) Date of Patent: Jul. 29, 2008

(54) IONIZED PHYSICAL VAPOR DEPOSITION APPARATUS USING HELICAL SELF-RESONANT COIL

(75) Inventors: Yuri Nikolaevich Tolmachev, Gyeonggi-do (KR); Dong-joon Ma, Gyeonggi-do (KR); Sergiy Yakovlevich Navala, Gyeonggi-do (KR); Dae-il Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 775 days.

(21) Appl. No.: 10/932,076

(22) Filed: Sep. 2, 2004

(65) Prior Publication Data
US 2005/0103623 A1 May 19, 2005

(30) Foreign Application Priority Data
Nov. 17, 2003 (KR) .................... 10-2003-0081098

(51) Int. Cl.
C23C 14/04 (2006.01)
C23C 14/34 (2006.01)
C23C 14/36 (2006.01)
C23C 14/42 (2006.01)

(52) U.S. Cl. ............ 204/298.02; 118/715; 118/723 AN; 118/723 I; 156/345.48; 204/192.1; 204/192.12; 204/192.3; 204/298.06; 204/298.11; 219/121.43; 315/111.21; 315/111.41; 427/569

(58) Field of Classification Search ............ 204/192.12, 204/192.3, 298.11; 219/121.43; 315/111.21, 315/111.41; 427/569
See application file for complete search history.

(56) References Cited

U.S. PATENT DOCUMENTS 5,234,529 A * 8/1993 Johnson
5,522,934 A * 6/1996 Suzuki et al.
5,763,851 A * 6/1998 Forster et al.
5,903,106 A  5/1999 Young et al.

(Continued)

FOREIGN PATENT DOCUMENTS

JP  10-259480  9/1998

(Continued)

*Primary Examiner*—Alexa D. Neckel
*Assistant Examiner*—Michael Band
(74) *Attorney, Agent, or Firm*—Buchanan Ingersoll & Rooney PC

(57) ABSTRACT

Provided is an ionized physical vapor deposition (IPVD) apparatus having a helical self-resonant coil. The IPVD apparatus comprises a process chamber having a substrate holder that supports a substrate to be processed, a deposition material source that supplies a material to be deposited on the substrate into the process chamber, facing the substrate holder, a gas injection unit to inject a process gas into the process chamber, a bias power source that applies a bias potential to the substrate holder, a helical self-resonant coil that produces plasma for ionization of the deposition material in the process chamber, one end of the helical self-resonant coil being grounded and the other end being electrically open, and an RF generator to supply an RF power to the helical self-resonant coil. The use of a helical self-resonant coil enables the IPVD apparatus to ignite and operate at very low chamber pressure such as approximately 0.1 mtorr, and to produce high density plasma with high efficiency compared to a conventional IPVD apparatus. Accordingly, a high efficiency of ionization of deposition material is achieved.

34 Claims, 7 Drawing Sheets

U.S. PATENT DOCUMENTS

| | | | |
|---|---|---|---|
| 5,961,793 A * | 10/1999 | Ngan | |
| 6,117,279 A | 9/2000 | Smolanoff et al. | |
| 6,184,623 B1 * | 2/2001 | Sugai et al. | |
| 6,238,528 B1 * | 5/2001 | Xu et al. | |
| 6,251,241 B1 * | 6/2001 | Shin et al. | |
| 6,254,745 B1 * | 7/2001 | Vukovic | |
| 6,308,654 B1 * | 10/2001 | Schneider et al. | |
| 6,361,667 B1 | 3/2002 | Kobayashi et al. | |
| 6,695,954 B2 * | 2/2004 | Hong | 204/192.12 |
| 6,929,720 B2 * | 8/2005 | Reynolds | 204/192.3 |
| 6,946,054 B2 * | 9/2005 | Brcka | 156/345.48 |
| 7,182,816 B2 * | 2/2007 | Kleshock et al. | 118/715 |
| 2001/0022158 A1 * | 9/2001 | Broka | |
| 2002/0104751 A1 * | 8/2002 | Drewery et al. | |
| 2002/0125223 A1 * | 9/2002 | Johnson et al. | |
| 2002/0187280 A1 * | 12/2002 | JOhnson et al. | |

FOREIGN PATENT DOCUMENTS

| | | |
|---|---|---|
| JP | 11-323543 | 11/1999 |
| JP | 2000-273629 | 10/2000 |
| JP | 2003-525519 | 8/2003 |
| WO | WO 01/65895 | 9/2001 |

* cited by examiner

IONIZED PHYSICAL VAPOR DEPOSITION APPARATUS USING HELICAL SELF-RESONANT COIL

BACKGROUND OF THE INVENTION

This application claims the priority of Korean Patent Application No. 2003-81098 filed on Nov. 17, 2003, in the Korean Intellectual Property Office, the disclosure of which is incorporated herein in its entirety by reference.

1. Field of the Invention

The present invention relates to an apparatus for ionized physical vapor deposition, and more particularly, to an apparatus for ionized physical vapor deposition using a helical self-resonant coil.

2. Description of the Related Art

Various types of systems for wafer fine processing for manufacturing a semiconductor device and flat display panel have been used. Amongst them, a physical vapor deposition (PVD) system is one of the most widely used for depositing a predetermined material film on a surface of a wafer for manufacturing a semiconductor device or a flat display panel. Examples of the PVD system include a magnetron sputtering apparatus, an E-beam evaporator system, and a thermal evaporator system.

In the conventional PVD system, a majority of particles, such as atoms or atomic clusters, ejected from a target material and being deposited on a substrate are neutral in charge. Therefore, a structure of the particles deposited on the substrate is not dense resulting in a poor qualify of deposited thin film and a surface of a thin film is not planarized. In order to solve this problem, a method of heating the substrate to a predetermined temperature has been tried, but heating the substrate can not be an appropriate solution when the substrate is formed of a material such as glass, having low resistance to heat.

In order to improve these drawbacks of the conventional PVD system, an ionized physical vapor deposition (IPVD) system has been developed. The IPVD system is configured to ionize particles ejected from a target material using plasma and to accelerate the ions by applying a bias voltage to the substrate. Accordingly, the IPVD system is known to have the advantage of providing a thin film having superior film quality and planarization.

FIG. 1 shows a schematic diagram of a magnetron sputtering apparatus depicted in U.S. Pat. No. 6,117,279 as an example of a conventional IPVD apparatus.

Referring to FIG. 1, the conventional magnetron sputtering apparatus has a vacuum chamber 12 that surrounds a plasma processing space 11. A substrate holder 14 for supporting a wafer 15 is mounted in a lower part of the vacuum chamber 12, and a cathode assembly 17 is mounted on an upper part of the vacuum chamber 12. The inside of the vacuum chamber 12 is maintained in a predetermined vacuum state by a vacuum pump 39. A process gas is supplied into the vacuum chamber 12 from a process gas source 40 through a flow control device 41. The cathode assembly 17 consists of magnets 76, a target 16 formed of a deposition material, and a target holder 18 wherein the target 16 is disposed facing the wafer 15 at a predetermined distance. A DC power source 21 for applying an electrical energy to the target 16 is connected to the cathode assembly 17 through an RF filter 22. An optional RF power source 24 is connected to the cathode assembly 17 through a matching network 25. Also, a bias power source 27 for supplying power to the wafer 15 is provided and connected to the substrate holder 14 through a matching network 28.

An RF coil 30 is wound around the vacuum chamber 12, and an RF power source 32 for supplying energy to the coil 30 is connected to the RF coil 30 via a matching network 33. The RF coil 30 generates inductively coupled plasma by supplying power to an upper space 26 of the vacuum chamber 12. The plasma produced ionizes the deposition material particles sputtered from the target 16. The ionized deposition material particles are accelerated toward the wafer 15 to which a bias energy is applied, and form a superior quality of a thin film on the surface of the wafer 15.

A dielectric window 60 for tight sealing with the upper space 26 of the vacuum chamber 12 where plasma is generated is mounted inside of the RF coil 30. A shield 70 to prevent a surface of the dielectric window 60 from coating build-up of the deposition material sputtered from the target 16 is mounted between the dielectric window 60 and the space 26.

A conventional IPVD apparatus having an above mentioned structure uses inductively coupled plasma generated by an RF coil, i.e., a non-resonant coil for ionization of the deposition material. However, the non-resonant coil can ignite plasma at a pressure range from 1 mTorr to a few tens mTorr, but it hardly can ignite plasma at a lower pressure than this range. Also, there is a disadvantage in that an ionization rate of the deposition material by the plasma produced by the RF coil is not satisfactory since the non-resonant coil has a certain limit to produce high-density plasma.

U.S. Pat. No. 5,903,106 discloses a plasma generating apparatus having an electrostatic shield. The electrostatic shield for controlling electromagnetic energy coupled to the plasma has a plurality of openings therethrough. However, when this configuration of electrostatic shield is applied to the IPVD apparatus, the deposition material may be sputtered to the coil that surrounds the electrostatic shield or a material for forming the coil may be sputtered on the substrate through the openings.

According to the foregoing aspects, a core technique that should be developed for the IPVD apparatus is a plasma source able to generate high density plasma even at very low pressure.

SUMMARY OF THE INVENTION

To solve the above and other conventional problems, the present invention provides an ionized physical vapor deposition (IPVD) apparatus having a helical self-resonant coil capable of producing high density plasma with high efficiency at very low pressure.

According to an aspect of the present invention, there is provided a ionized physical vapor deposition apparatus (IPVD), comprising: a process chamber having a substrate holder that supports a substrate to be processed; a deposition material source that supplies a material to be deposited on the substrate into the process chamber, facing the substrate holder; a gas injection unit to inject a process gas into the process chamber; a bias power source that applies a bias potential to the substrate holder; a helical self-resonant coil that produces plasma for ionization of the deposition material in the process chamber, one end of the helical resonant-coil being grounded and the other end being electrically open; and an RF generator to supply an RF power to the helical self-resonant coil.

According to an aspect of the present invention, the helical self-resonant coil is disposed in the process chamber and wound close to an inner circumference of the process chamber.

According to an aspect of the present invention, the RF generator comprises:

a DC power source; and a resonance amplifier, wherein the DC power source applies a trigger pulse to the resonance amplifier, and the resonance amplifier amplifies the trigger pulse and outputs it to the helical self-resonant coil.

According to an aspect of the present invention, the apparatus further comprises: a first tap to be applied an output from the resonance amplifier is disposed on an arbitrary point of the helical self-resonant coil; and a second tap to positively feed back of a portion of the output from the resonance amplifier to the resonance amplifier is formed between the first tap and the grounded end.

According to an aspect of the present invention, the first tap and the second tap are respectively moveable along the helical self-resonant coil.

According to an aspect of the present invention, changing at least one of a pulse voltage, pulse duration, and a pulse period, controls a plasma density and an ionization rate of the deposition material.

According to an aspect of the present invention, the helical self-resonant coil is wound with a uniform diameter.

According to an aspect of the present invention, the helical self-resonant coil is formed in a conic configuration; a diameter of the helical resonant-coil gradually increases toward the substrate holder.

According to an aspect of the present invention, an ignition electrode having a ring shape is connected to the open end of the helical self-resonant coil and is disposed in the process chamber.

According to an aspect of the present invention, a floating shield to prevent discharge between the ignition electrode and the process chamber is disposed in the process chamber.

According to an aspect of the present invention, the floating shield is formed in a cylindrical shape and surrounds the substrate holder.

According to an aspect of the present invention, the gas injection unit comprises: a gas source; and a ring shaped gas injector that has a plurality of gas distribution holes opened toward the inside of the process chamber, and disposed on the process chamber.

According to an aspect of the present invention, the bias power source is electrically connected to the substrate holder through a matching network.

According to an aspect of the present invention, the apparatus further comprises a faraday shield to control electromagnetic energy coupled to the plasma, the faraday shield being disposed inside of the helical self-resonant coil.

According to an aspect of the present invention, the faraday shield comprises an inner shield that surrounds the space for producing plasma, the inner shield in which a plurality of inner slots are formed, and an outer shield that surrounds the inner shield, the outer shield in which a plurality of outer slots are formed, wherein the inner slots and the outer slots are disposed to cross each other.

According to an aspect of the present invention, the apparatus further comprises a plurality of magnets disposed along the outer circumference of the process chamber, the magnets being spaced apart at a predetermined equal distance.

According to an aspect of the present invention, the magnets are permanent magnets.

According to an aspect of the present invention, the process chamber comprises: a lower chamber; and an upper chamber disposed on the lower chamber, wherein the upper chamber is detachable from the lower chamber.

According to an aspect of the present invention, the substrate holder is disposed in the lower chamber, and the helical self-resonant coil is disposed in the upper chamber.

According to an aspect of the present invention, the deposition material source comprises: a cathode assembly that includes a target holder disposed on the process chamber, a target formed of the deposition material attached on the front face of the target holder facing the substrate holder, and a magnet pack disposed on the back side of the target holder; and a cathode power source that applies a negative potential to the target connected to the cathode assembly.

According to an aspect of the present invention, the cathode power source is a DC power source.

According to an aspect of the present invention, the DC power source is electrically connected to the cathode assembly through an RF filter.

According to another aspect of the present invention, there is provided an ionized physical vapor deposition apparatus, comprising: a process chamber that includes a lower chamber and an upper chamber mounted on the lower chamber; a substrate holder that supports a substrate to be processed, disposed in the lower chamber; a cathode assembly that includes: a target holder disposed on the upper chamber; a target that provides a deposition material to be deposited on the substrate, attached on the front face of the target holder facing the substrate holder; and a magnet pack disposed on the back side of the target holder, a cathode power source that applies a negative potential to the target connected to the cathode assembly; a gas injection unit to inject process gas into the process chamber; a bias power source to apply a bias potential to the substrate holder; a helical self-resonant coil that produces plasma for ionization of the deposition material in the process chamber, one end of the helical self-resonant coil being grounded and the other end being electrically open; and an RF generator to supply an RF power to the helical self-resonant coil.

According to an aspect of the present invention, the RF generator comprises: a DC power source; and a resonance amplifier, wherein the DC power source applies a trigger pulse to the resonance amplifier, and the resonance amplifier amplifies the trigger pulse and outputs it to the helical self-resonant coil.

According to an aspect of the present invention, the apparatus further comprises: a first tap to be applied an output from the resonance amplifier is disposed on an arbitrary point of the helical self-resonant coil; and a second tap to positively feed back of a portion of the output from the resonance amplifier to the resonance amplifier is formed between the first tap and the grounded end.

According to an aspect of the present invention, the helical self-resonant coil is wound with a uniform diameter.

According to an aspect of the present invention, the helical self-resonant coil is formed in a conic configuration; a diameter of the helical self-resonant coil gradually increases toward the substrate holder.

According to an aspect of the present invention, an ignition electrode having a ring shape is connected to the opened end of the helical self-resonant coil and is disposed in the upper chamber.

According to an aspect of the present invention, a floating shield to prevent discharge between the ignition electrode and the lower chamber is disposed in the lower chamber.

According to an aspect of the present invention, the gas injection unit comprises: a gas source; and a ring shaped gas injector that has a plurality of gas distributing holes opened toward the inside of the upper chamber, and disposed on the upper chamber.

According to an aspect of the present invention, the apparatus further comprises a faraday shield that controls an electromagnetic energy coupled to the plasma disposed inside of the helical self-resonant coil.

According to an aspect of the present invention, the faraday shield comprises an inner shield that surrounds the space for producing plasma, the inner shield in which a plurality of inner slots are formed, and an outer shield that surrounds the inner shield, the outer shield in which a plurality of outer slots are formed, wherein the inner slots and the outer slots are disposed to cross each other.

According to an aspect of the present invention, the apparatus further comprises a plurality of magnets disposed along the outer circumference of the upper chamber, the magnets being spaced apart at a predetermined distance.

According to an aspect of the present invention, the cathode power source is a DC power source.

According to an aspect of the present invention, the DC power source is electrically connected to the cathode assembly through an RF filter.

According to still another aspect of the present invention, there is provided an ionized physical vapor deposition apparatus, comprising: a process chamber having a substrate holder that supports a substrate to be processed; a deposition material source that supplies a material to be deposited on the substrate into the process chamber facing the substrate holder; a gas injection unit to inject a process gas into the process chamber; a bias power source that applies a bias potential to the substrate holder; a plasma generator that generates plasma for ionizing the deposition material in the process chamber; and a faraday shield to control electromagnetic energy coupled to the plasma disposed inside of the helical self-resonant coil, wherein the faraday shield comprises an inner shield that surrounds the space for producing plasma, the inner shield in which a plurality of inner slots are formed, and an outer shield that surrounds the inner shield, the outer shield in which a plurality of outer slots are formed, wherein the inner slots and the outer slots are disposed to cross each other.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
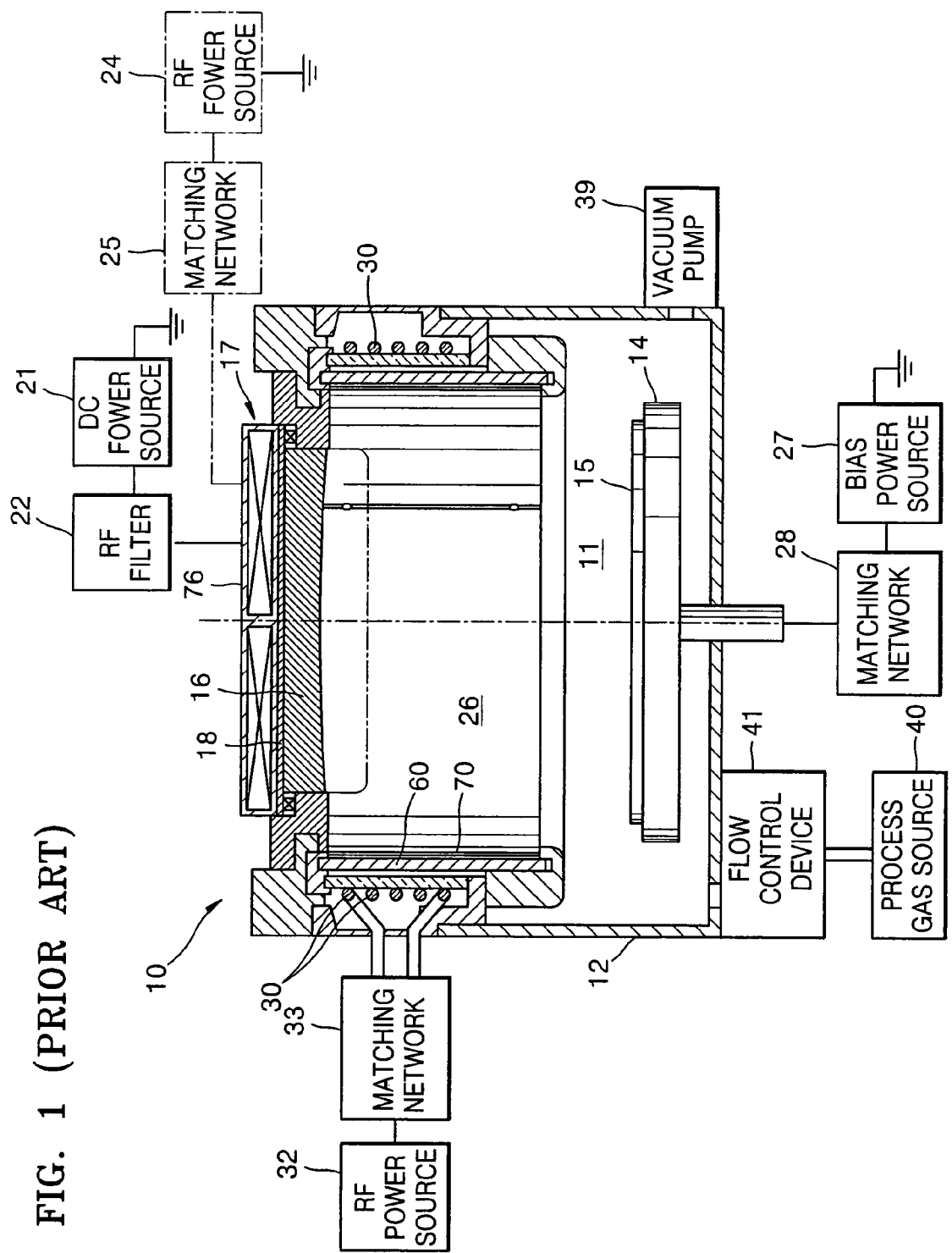
FIG. 1 is a schematic drawing of a magnetron sputtering device as an example of a conventional IPVD apparatus.

Hereinafter, the present invention will be described more fully with reference to the accompanying drawings in which preferred embodiments of the invention are shown. Like reference numerals refer to like elements throughout the drawings. The present invention can be applied to various IPVD apparatus such as a magnetron sputtering apparatus, an E-beam evaporator, and a thermal evaporator. However, the present invention will be mainly described for the case of applying it to the magnetron sputtering apparatus.

Figure 2:
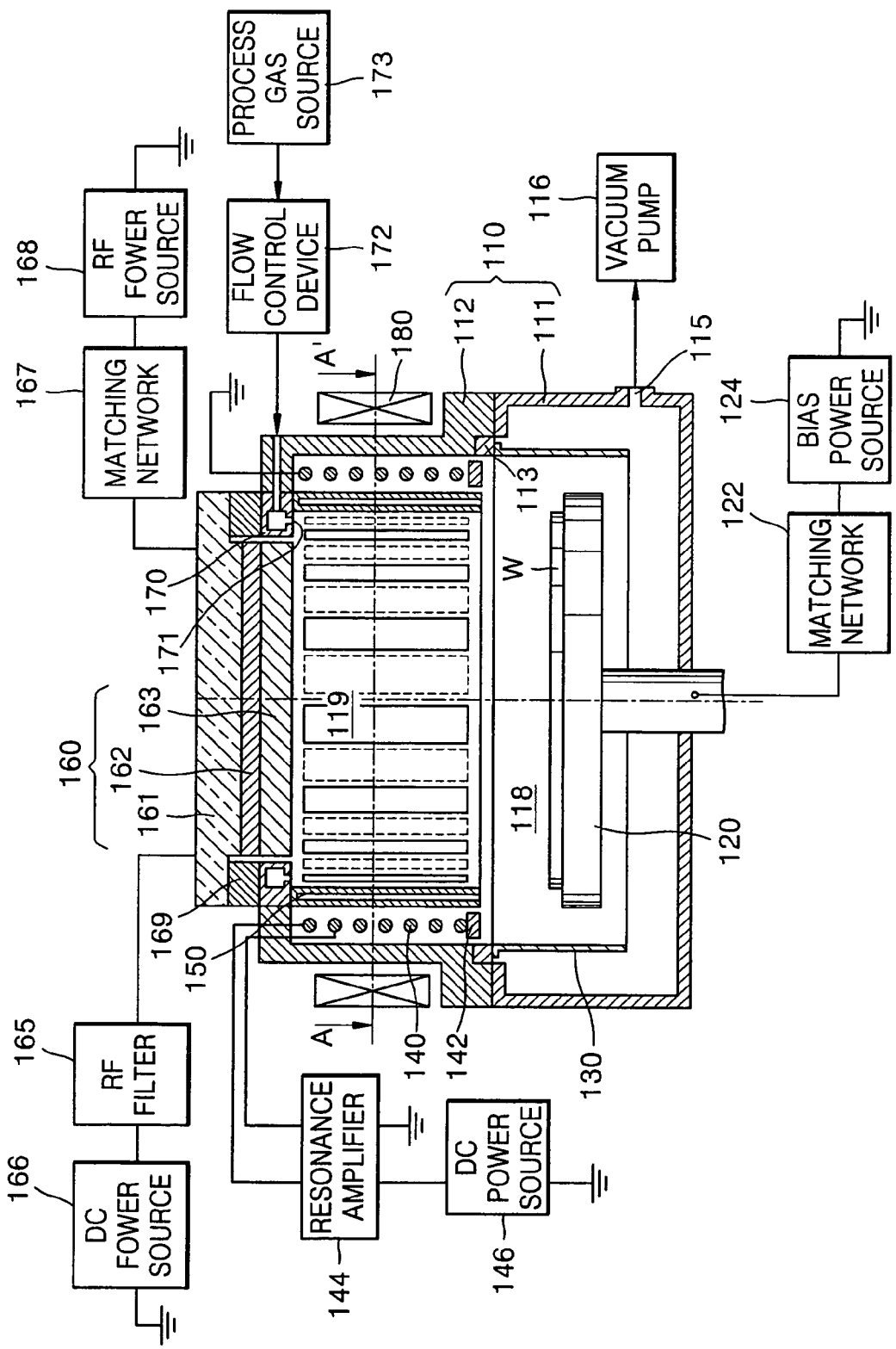
FIG. 2 is a vertical cross-sectional view of a magnetron sputtering apparatus as an IPVD apparatus having a helical self-resonant coil according to a preferred embodiment of the present invention.
Figure 3:
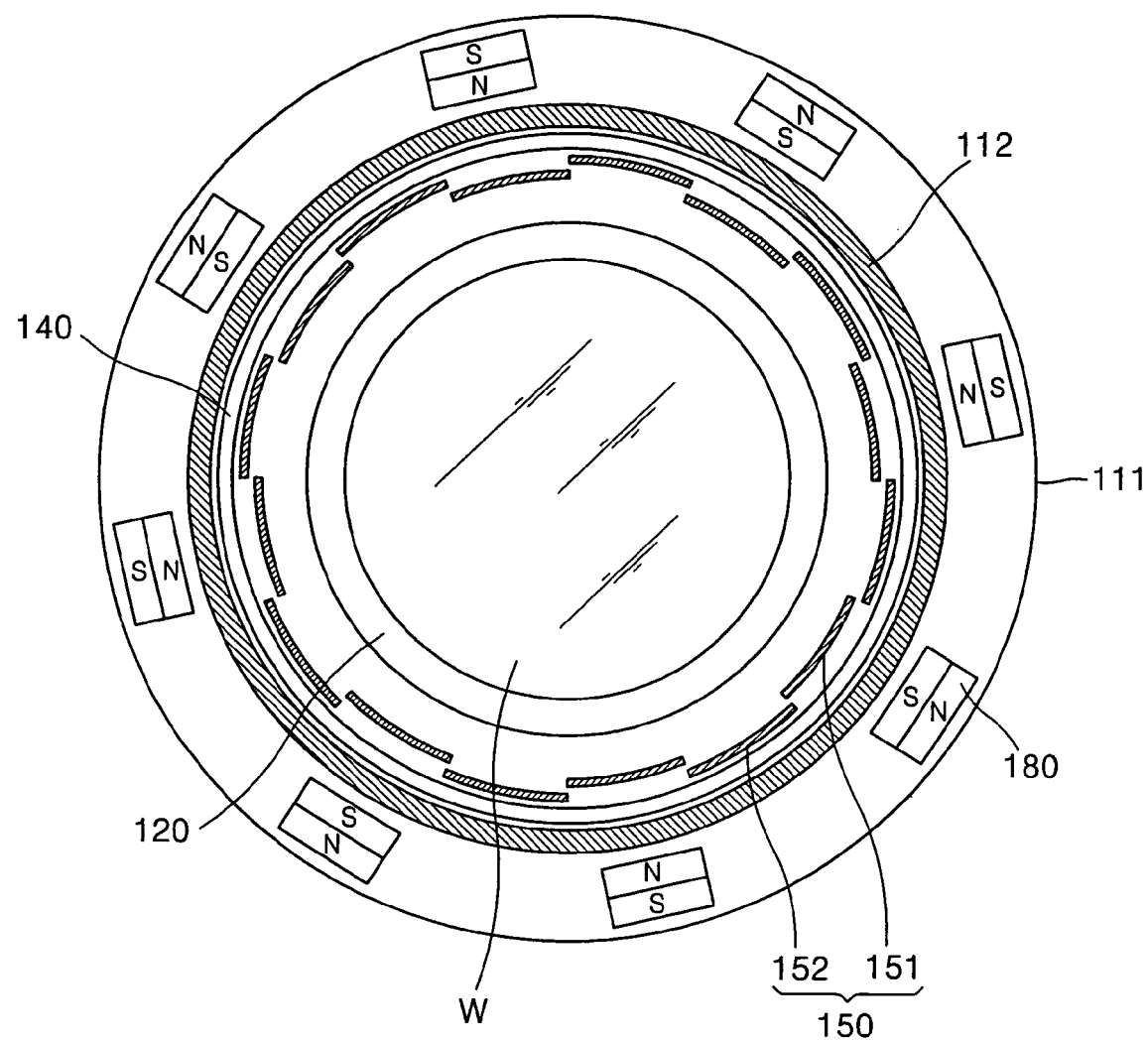
FIG. 3 is a horizontal cross-sectional view of the magnetron sputtering apparatus along line A-A' of FIG. 2.

FIG. 2 is a vertical cross-sectional view of a magnetron sputtering apparatus as an IPVD apparatus having a helical self-resonant coil, according to a preferred embodiment of the present invention. FIG. 3 is a horizontal cross-sectional view of the magnetron sputtering apparatus taken along line A-A' of FIG. 2.

Referring to FIGS. 2 and 3, the ionized physical vapor deposition (IPVD) apparatus is an apparatus to deposit a material on a substrate or a wafer W for manufacturing a semiconductor device, the substrate or the wafer W being loaded in a process chamber 110 for depositing a deposition material ionized by high density plasma produced by a helical self-resonant coil 140 at low pressure.

The IPVD apparatus comprises a process chamber 110 having a substrate holder 120, a deposition material source that supplies a deposition material to be deposited on a wafer W, a gas injection unit that injects a process gas into the process chamber 110, a bias power source 124 for applying a bias potential to the substrate holder 120, a helical self-resonant coil 140 for producing plasma in the process chamber 110, and an RF generator for supplying power to the helical self-resonant coil 140.

The process chamber 110 comprises a lower chamber 111 and an upper chamber 112 mounted on the lower chamber 111. The two chambers are detachable. The substrate holder 120 is disposed in a lower space 118, i.e., a space of the lower chamber 111, and the helical self-resonant coil 140 is disposed in an upper space 119, i.e., a space of the upper chamber 112. A deposition material source is disposed on the upper chamber 112. To maintain the process chamber 110 in a predetermined vacuum state, a vacuum pump 116 is connected to the lower chamber 111 through a vacuum suction port 115.

Since the process chamber 110 according to the present invention has a detachable structure, the upper chamber 112 in which the deposition material source and the helical self-resonant coil 140 are disposed can be used in association with the lower chamber 111 in which a variety of substrate holders 120 having different sizes can be loaded. The detachable configuration of the process chamber 110 also allows easy maintenance of the process chamber 110.

The deposition material source that provides the material to be deposited on a surface of a wafer W is disposed on the upper chamber 112 facing the substrate holder 120. The deposition material source can be formed of different configurations according to the types of the IPVD apparatus. A magnetron gun used for a magnetron sputtering apparatus is employed as an example of the deposition material source of the present invention.

The deposition material source, i.e., the magnetron gun, comprises a cathode assembly 160 having a target 163, and a cathode power source 166 to supply potential to the target 163. A target holder 162 for supporting the target 163 is disposed on the upper chamber 112. The target 163 is attached on a front surface of the target holder 162 facing the substrate holder 120. A magnet pack 161 is disposed on the backside of the target holder 162. The magnet pack 161 includes a plurality of electromagnets or permanent magnets that produce a magnetic field for trapping electrons ejected from the cathode assembly 160 to the process chamber 110. The electromagnets or permanent magnets may be fixedly installed. However, the electromagnets or permanent magnets can be rotatably or movably installed. The cathode assembly 160 is insulated from the upper chamber 112 by an insulator 169 disposed on the outer circumference of the cathode assembly 160. The insulator 169 can be formed of a ceramic. The cathode assembly 160 can be formed in other configurations known in the art consistent with the description of the present invention.

The cathode power source 166, which applies a negative potential to the target 163, conventionally uses a DC power source 166. Preferably, the DC power source 166 is connected to the cathode assembly 160 via an RF filter 165. Alternatively, an RF power source 168 as a power source can be connected to the cathode assembly 160 via a matching network 167.

The bias power source 124 applies a bias potential to the substrate holder 120 to move the ionized deposition material produced by plasma toward the wafer W on the substrate holder 120, the plasma being generated by the helical self-resonant coil 140. That is, the ionized deposition material is accelerated toward the wafer W by the bias potential applied to the substrate holder 120. Thus, a good quality thin film having a planarized surface is formed on the surface of the wafer W. An RF power source can be used as the bias power source 124. At this time, a matching network 122 for increasing a coupling efficiency of the RF power can be disposed between the bias power source 124 and the substrate holder 120.

The gas injection unit is a unit for injecting a process gas, i.e., a plasma source gas into the process chamber 110. The gas injection unit includes a process gas source 173 for supplying a process gas and a ring shaped gas injector 170 having a plurality of gas distribution holes 171 opened toward the inner space of the upper chamber 112. A gas flow control device 172 controls a flowrate of the process gas, i.e., an inert gas such as argon supplied from the gas source 173 to the gas injector 170.

The helical self-resonant coil 140 produces plasma for ionizing the deposition material in the upper chamber 112, one end of which, i.e., an upper end, is grounded, and the other end of which, i.e., a lower end is electrically open. The helical self-resonant coil 140 has multiple turns along a circumference close to an inner wall of the upper chamber 112, preferably the turns having the same diameter. The helical self-resonant coil 140 has a length corresponding to one quarter of a wavelength of the conventionally applied RF voltage.

The RF generator for supplying an RF power to the helical self-resonant coil 140 can use one of the generators known in the art. Preferably, an RF generator includes a resonance amplifier 144 and a DC power source 146. The DC power source 146 applies a trigger pulse to the resonance amplifier 144, and the resonance amplifier 144 outputs the trigger pulse to the helical self-resonant coil 140 after amplifying the trigger pulse.

The helical self-resonant coil 140 provides an advantage of igniting and maintaining high density plasma with high efficiency at low pressure. Therefore, the use of the helical self-resonant coil 140 enhances the ionization efficiency of the deposition material in comparison with the conventional inductively coupled RF coil.

The RF generator that includes the helical self-resonant coil 140, resonance amplifier 144, and the DC power source 146 will be described in detail later.

Preferably, an ignition electrode 142 having a ring shape is connected to the open end of the helical self-resonant coil 140 and is disposed in the upper chamber 112. The ignition electrode 142 is coaxially mounted with the helical self-resonant coil 140 and is disposed close to the lower part of the upper chamber 112.

Plasma ignition commences at the open end of the helical self-resonant coil 140 and propagates to other parts of the helical self-resonant coil 140. At this time, the plasma can be ignited uniformly on an extended area because the ignition electrode 142 having a large surface area is connected to the open end of the helical self-resonant coil 140. Accordingly, the plasma density distribution in the upper chamber 112 is formed uniformly.

A floating shield 130 to prevent a discharge between the ignition electrode 142 and the lower chamber 111 is installed in the lower chamber 111. The floating shield 130 is formed in a cylindrical shape and surrounds the substrate holder 120. A ceramic insulator 113 mounted on the lower part of the upper chamber 112 supports the floating shield 130.

The IPVD apparatus according to the present invention further includes a faraday shield 150 that controls electromagnetic energy coupled to plasma. The faraday shield 150 is disposed in an inner side of the helical self-resonant coil 140.

The faraday shield 150 comprises an inner shield 151 (refer to FIG. 6) and an outer shield 152. The inner shield 151 is formed in a cylindrical shape and surrounds the plasma producing space, i.e., the upper space 119, and the outer shield 152, formed at a predetermined distance from the inner shield 151, is formed in a cylindrical shape and surrounds the inner shield 151. The faraday shield 150 will be described later.

The IPVD apparatus according to the present invention further comprises a plurality of magnets 180 outside of the process chamber 110, as a means for forming a magnetic field in the process chamber 110. More specifically, a plurality of magnets 180 spaced apart at a predetermined distance are disposed along the outer circumference of the upper chamber 112 with alternating N-poles and S-poles. Permanent magnets can be used as the magnets 180.

A magnetic field that confines the plasma is formed close to an inner wall of the upper chamber 112 by the plurality of magnets 180. This phenomenon is called a multi-pole confinement. That is, when disposing the plurality of magnets 180 on the outer circumference of the upper chamber 112 alternating with N-poles and S-poles, a magnetic mirror effect that reduces loss of charged electrons into walls, i.e., a wall loss, is induced close to the inner walls in the upper chamber 112. Accordingly, a uniform distribution of plasma density is obtained in a radial direction of the upper chamber 112.

Figure 4:
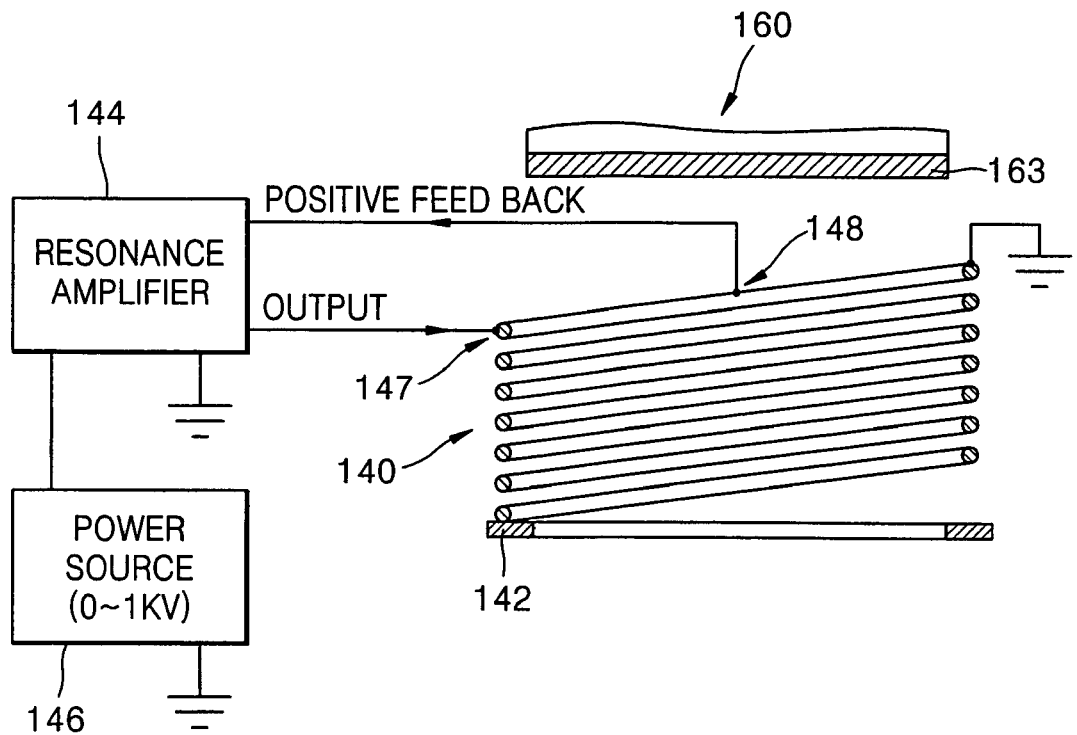
FIG. 4 is a schematic drawing of a connection between the helical self-resonant coil and the RF generator depicted in FIG. 2.

FIG. 4 is a schematic drawing of a connection between the helical self-resonant coil and the RF generator depicted in FIG. 2.

Figure 5:
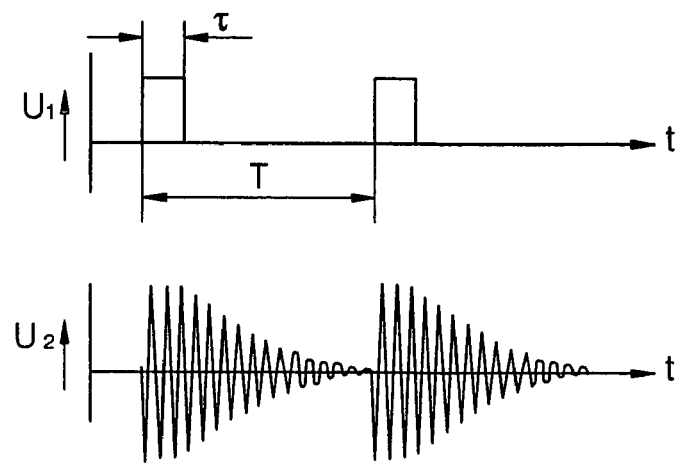
FIG. 5 shows a wave shape of a trigger pulse applied to a resonant amplifier and a wave shape of input voltage applied to the helical self-resonant coil.

FIG. 5 shows a wave shape of a trigger pulse applied to a resonant amplifier and a wave shape of input voltage applied to the helical self-resonant coil.

Referring to FIG. 4, an RF generator for supplying an RF power to a helical self-resonant coil 140 includes a DC power source 166 and a resonance amplifier 144. As depicted in FIG. 5, the DC power source 146 applies approximately a 1 kV trigger pulse voltage $U_1$ with a predetermined pulse duration τ and pulse period T to the resonance amplifier 144. The resonance amplifier 144 amplifies the trigger pulse and outputs it to the helical self-resonant coil 140. The output from the resonance amplifier 144 is applied to helical self-resonant coil 140 through a first tap 147 provided on an arbitrary point such as a first turn or a second turn of the self-resonant coil 140. A second tap 148 is formed between the first tap 147 and the grounded end. A portion of the output from the resonance amplifier 144 is positively fed back to the resonance amplifier 144 from the second tap 148. Accordingly, an input voltage $U_2$ having a wave shape as depicted in FIG. 5, i.e., an output voltage from the resonance amplifier 144 is applied to the helical self-resonant coil 140. An RF oscillation in the helical self-resonant coil 140 ignites the plasma inside of the helical self-resonant coil 140 by inducing much higher RF voltage $U_3$ than the input voltage $U_2$ at the ignition electrode 150. Since the RF generator according to the present invention does not include a matching network and a transformer, most of the consumed power is used for forming plasma, thereby increasing plasma generation efficiency per power consumption.

When the RF power is applied to the helical self-resonant coil 140, a current flowing through the helical self-resonant coil 140 generates a time-varying magnetic field. Then, an electric field is induced by the time-varying magnetic field. The induced electric field ionizes the plasma source gas into plasma. At this time, one end from the point where the RF power is applied to the helical self-resonant coil 140, i.e., the grounded end, is inductively coupled, and the other end, i.e., the open end, is capacitively coupled. In this resonant condition, effective energy transportation to the helical self-resonant coil 140 is achieved. Therefore, the helical self-resonant coil 140 enables the production of high density plasma that increases the ionization efficiency of the deposition material.

The inert gas supplied as a plasma source gas is required to initiate the ignition of the plasma. Therefore, the formation of plasma can be maintained steadily at a very low chamber pressure such as approximately 0.1 mTorr because supplying of the inert gas is not further necessary. More specifically, a number of sputtered particles ejected from a deposition material such as metal ions in the plasma increases with the increase in the ionization efficiency of the deposition material in the chamber. The increased number of electrons effectively maintains the continuous ionization of the metal atoms by colliding themselves without further introduction of the inert gas.

Preferably, the two taps 147 and 148 are moveable along the helical self-resonant coil 140, respectively. An optimum point for applying the RF power to obtain an optimum resonance, which is essential for securing high density plasma, is detected by moving the two taps 147 and 148 along the helical self-resonant coil 140.

The plasma density and the ionization efficiency of the deposition material in association with the plasma density additionally can be controlled by varying the trigger pulse voltage U1, pulse duration time τ, and pulse period T.

Figure 6:
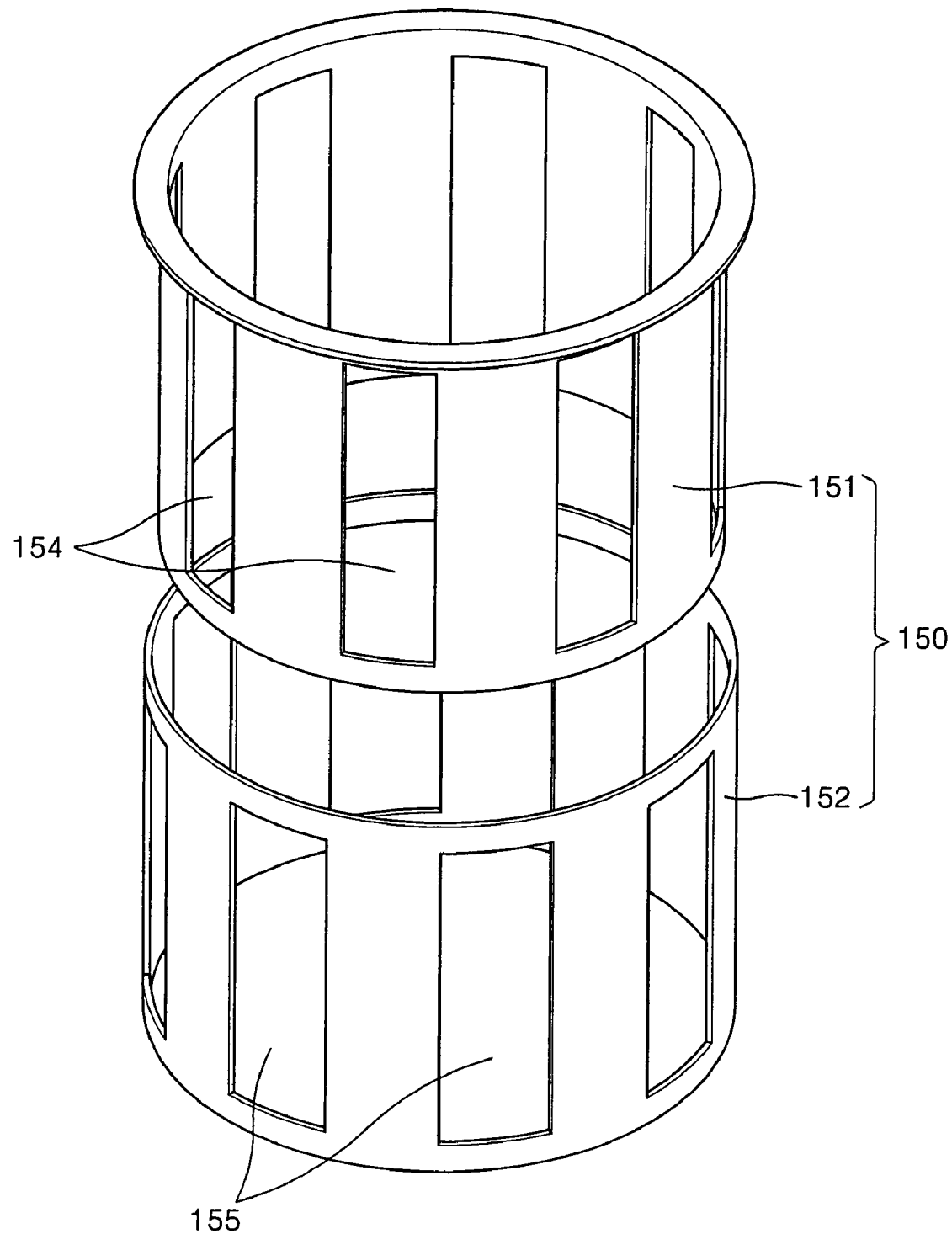
FIG. 6 is a perspective view of a faraday shield depicted in FIG. 2.

FIG. 6 is an exploded perspective view of the faraday shield 150 depicted in FIG. 2.

Referring to FIG. 6, the faraday shield 150, as described above, includes the inner shield 151 and the outer shield 152. The inner shield 151 is formed in a cylindrical shape having a predetermined diameter, and has a plurality of inner slots 154 spaced apart at a predetermined distance around the circumference of the inner shield 151. The outer shield 152 which has a slightly bigger diameter than the inner shield 151 is also formed in a cylindrical shape having a plurality of outer slots 155 spaced apart at a predetermined distance around the circumference of the outer shield 152

The inner slots 154 and the outer slots 155 reduce an induced RF current flowing through the faraday shield 150 resulting in the decrease in the plasma potential. At a low plasma potential, ion energy can be controlled more precisely thereby increasing a precision degree of the process. That is, the process can be controlled precisely and effectively using the faraday shield 150 having the slots 154 and 155.

The inner slots 154 and the outer slots 155 are disposed to cross each other. In this configuration of the faraday shield 150 having a plurality of slots 154, 155, the helical self-resonant coil 140 disposed on the outer region of the faraday shield 150 is not directly exposed to the space for producing plasma, i.e., the upper space 119 within the faraday shield 150. Accordingly, depositing the deposition material through the slots in the prior art prevents the formation of coating on the helical self-resonant coil 140 by depositing the deposition material through the slots in the prior art.

Figure 7:
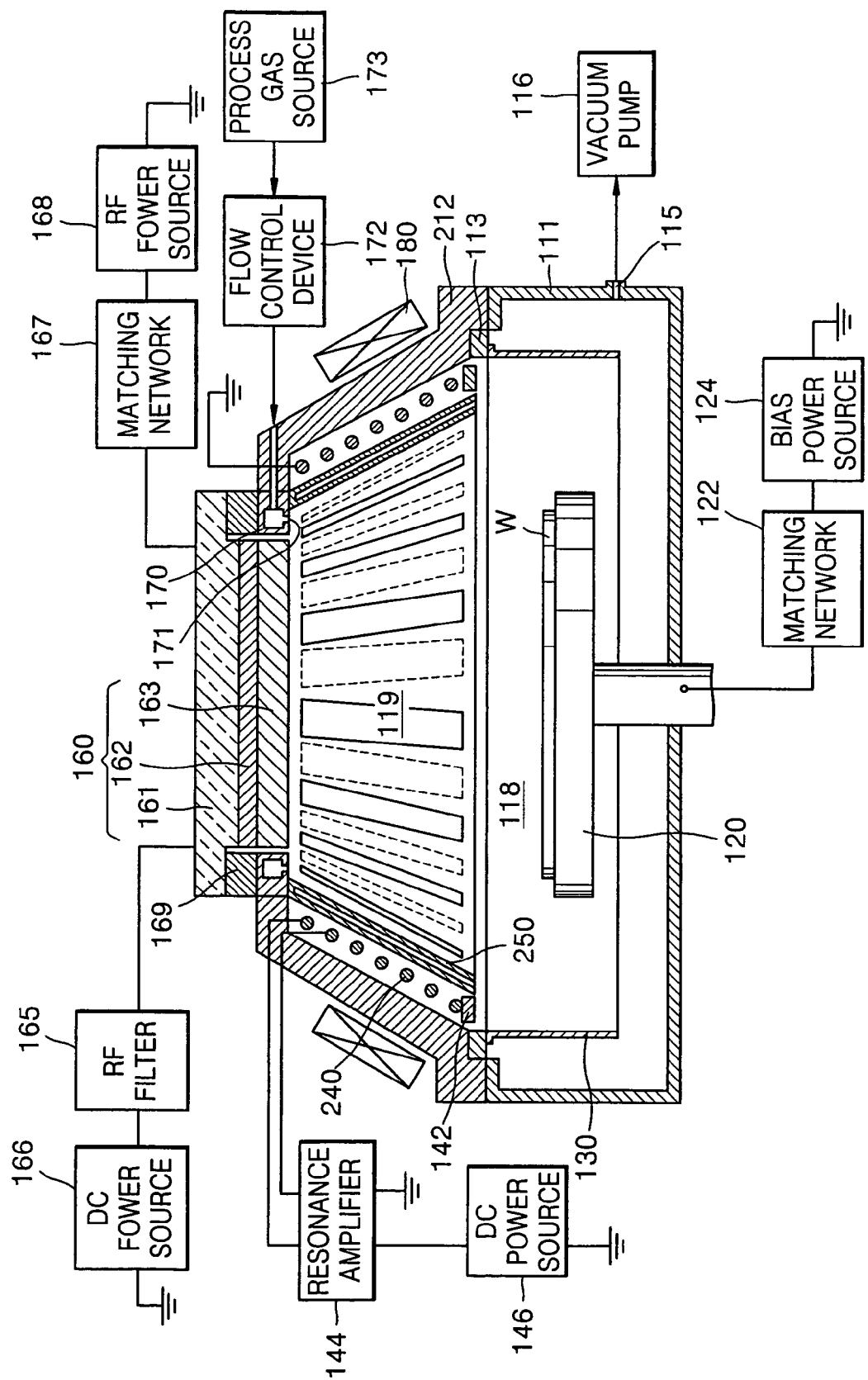
FIG. 7 is a vertical cross-sectional view of a magnetron sputtering device having a cone shape helical self-resonant coil as an IPVD apparatus according to a preferred embodiment of the present invention.

FIG. 7 is a vertical cross-sectional view of a magnetron sputtering device having a conic shape helical self-resonant coil, as an IPVD apparatus according to a preferred embodiment of the present invention.

Referring to FIG. 7, in an IPVD apparatus according to the present invention, a helical self-resonant coil 240 is formed in a conic configuration, a diameter of the coil 240 gradually increasing toward the substrate holder 120. Accordingly, an upper chamber 212 and a faraday shield 250 are also formed having conic shapes. The rest of the components are configured as in the first embodiment, therefore, the descriptions thereof are omitted.

Regarding the conic of helical self-resonant coil 240, unlike the cylindrical coil 140 depicted in FIG. 2, a distribution of current and voltage according to a vertical axis of the coil 240 varies because of the variation of the length of each turn of the coil 240. Due to the variation of current and voltage distribution and the different radius of each turn, the RF power coupled to plasma can be controlled by adjusting an angle θ between a slope of the helical self-resonant coil 240 and the vertical axis, and thereby a distribution of plasma density in the process chamber 110 can be controlled.

Figure 8:
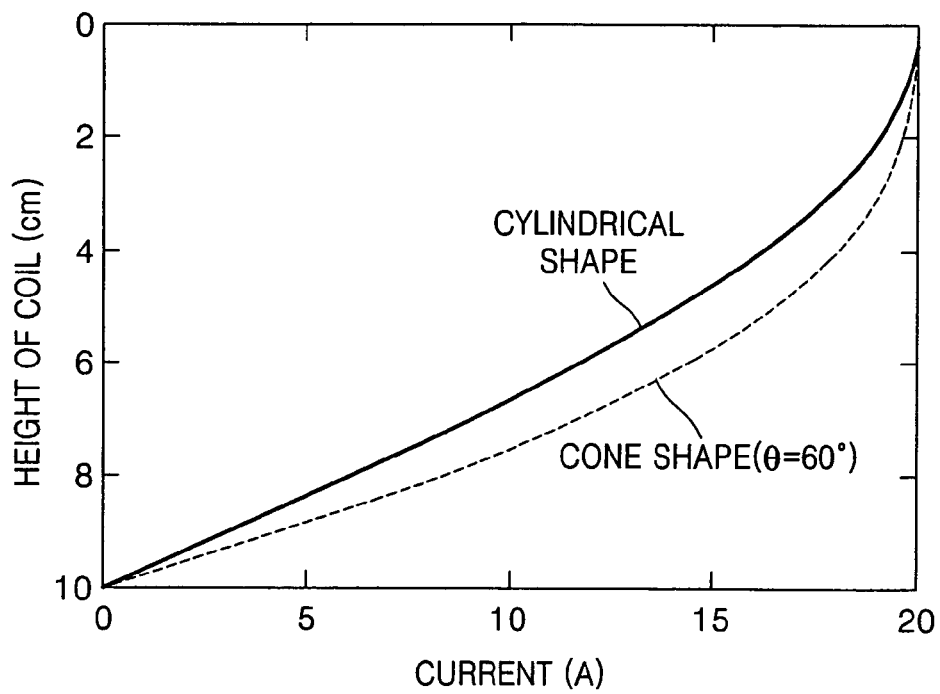
FIG. 8 is a graph showing a current distribution of a cylindrical coil and a conic coil.

FIG. 8 is a graph showing a current distribution of a cylindrical coil and a conic coil.

Figure 9:
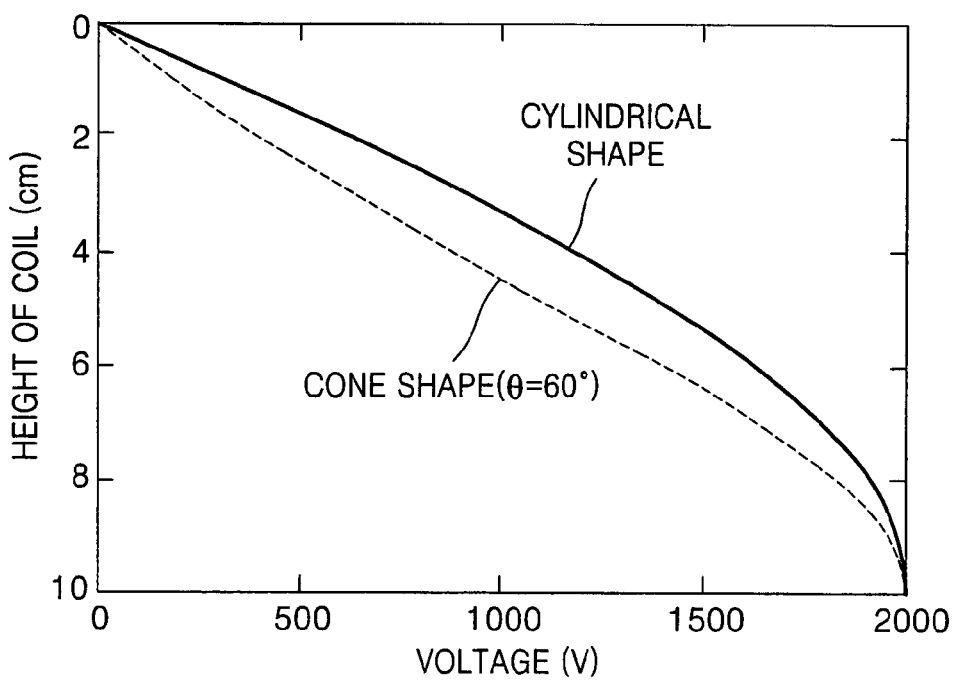
FIG. 9 is a graph showing a voltage distribution of a cylindrical coil and a conic coil.

FIG. 9 is a graph showing a voltage distribution of a cylindrical coil and a conic coil.

Referring to FIGS. 8 and 9, in a case when the cylindrical coil and the conic coil have the same height of 10 cm, it is seen that the distribution of current and voltage in each coil is different. This is because the conic coil additionally provides an opportunity to control the plasma density.

According to the foregoing descriptions, the IPVD apparatus according to the present invention provides the following advantages:

First, the use of a helical self-resonant coil enables the IPVD apparatus to ignite and operate at very low chamber pressure such as approximately 0.1 mTorr, and to produce high density plasma with high efficiency compared to a conventional IPVD apparatus. Accordingly, a high ionization efficiency of a deposition material is achieved.

Second, providing a faraday shield having a plurality of slots in the inside of a helical self-resonant coil can easily control plasma potential in the process chamber. A coating problem in the prior art, which occurs by depositing a deposition material on the self-resonant coil, the deposition material being sputtered from a space for producing plasma through slots on a shield, is avoided because the helical self-resonant coil disposed on an outer region of the faraday shield is not directly exposed to the space for producing plasma but covered by the faraday shield.

Third, since the process chamber is configured into an upper chamber and a lower chamber, the upper chamber having a deposition material source and a helical self-resonant coil can be used in various combinations with a lower chamber that could have substrate holders of diverse size.

Fourth, by providing a plurality of magnets disposed along the circumference of the process chamber, loss of charged electrons into walls is reduced. Therefore, an enhanced uniform plasma density along the radial direction in the process chamber is obtained.

Fifth, when the helical self-resonant coil is wound in a conic shape, a plasma density in the process chamber can be readily controlled.

While this invention has been particularly shown and described with reference to a preferred embodiment thereof, it will be understood by those skilled in the art that various changes in form and details may be made therein without departing from the spirit and scope of the present invention. For example, although a magnetron sputtering apparatus is mainly described in the present invention, this technology of the present invention can be applied to other IPVD apparatus such as an E-beam evaporator or a thermal evaporator. Accordingly, the true scope of the present invention is determined not by the above description, but by the appended claims and their equivalents.

What is claimed is:

1. A ionized physical vapor deposition apparatus (IPVD), comprising:
   a process chamber having a substrate holder that supports a substrate to be processed;
   a deposition material source that supplies a material to be deposited on the substrate into the process chamber, facing the substrate holder;
   a gas injection unit to inject a process gas into the process chamber;
   a bias power source that applies a bias potential to the substrate holder;
   a helical self-resonant coil that produces plasma for ionization of the deposition material in the process chamber, one end of the helical resonant-coil being grounded and the other end being electrically open; and
   an RF generator to supply an RF power to the helical self-resonant coil, wherein the RF generator comprises:
      a DC power source; and
      a resonance amplifier,
      wherein the DC power source applies a trigger pulse to the resonance amplifier, and the resonance amplifier amplifies the trigger pulse and outputs it to the helical self-resonant coil.

2. The ionized physical vapor deposition apparatus of claim 1, wherein the helical self-resonant coil is disposed in the process chamber and wound close to an inner circumference of the process chamber.

3. The ionized physical vapor deposition apparatus of claim 1 further comprising:
   a first tap to be applied an output from the resonance amplifier is disposed on an arbitrary point of the helical self-resonant coil; and
   a second tap to positively feed back of a portion of the output from the resonance amplifier to the resonance amplifier is formed between the first tap and the grounded end.

4. The ionized physical vapor deposition apparatus of claim 3, wherein the first tap and the second tap are respectively moveable along the helical self-resonant coil.

5. The ionized physical vapor deposition apparatus of claim 3, wherein changing at least one of a pulse voltage, pulse duration, and a pulse period, controls a plasma density and an ionization rate of the deposition material.

6. The ionized physical vapor deposition apparatus of claim 1, wherein the helical self-resonant coil is wound with a uniform diameter.

7. The ionized physical vapor deposition apparatus of claim 1, wherein the helical self-resonant coil is formed in a conic configuration, a diameter of the helical resonant-coil gradually increases toward the substrate holder.

8. The ionized physical vapor deposition apparatus of claim 1, wherein an ignition electrode having a ring shape is connected to the open end of the helical self-resonant coil and is disposed in the process chamber.

9. The ionized physical vapor deposition apparatus of claim 8, wherein a floating shield to prevent discharge between the ignition electrode and the process chamber is disposed in the process chamber.

10. The ionized physical vapor deposition apparatus of claim 9, wherein the floating shield is formed in a cylindrical shape and surrounds the substrate holder.

11. The ionized physical vapor deposition apparatus of claim 1, wherein the gas injection unit comprises:
    a gas source; and
    a ring shaped gas injector that has a plurality of gas distribution holes opened toward the inside of the process chamber, and disposed on the process chamber.

12. The ionized physical vapor deposition apparatus of claim 1, wherein the bias power source is electrically connected to the substrate holder through a matching network.

13. The ionized physical vapor deposition apparatus of claim 1 further comprising a faraday shield to control electromagnetic energy coupled to the plasma, the faraday shield being disposed inside of the helical self-resonant coil.

14. The ionized physical vapor deposition apparatus of claim 13, wherein the faraday shield comprises an inner shield that surrounds the space for producing plasma, the inner shield in which a plurality of inner slots are formed, and an outer shield that surrounds the inner shield, the outer shield in which a plurality of outer slots are formed, wherein the inner slots and the outer slots are disposed to cross each other.

15. The ionized physical vapor deposition apparatus of claim 1 further comprising a plurality of magnets disposed along the outer circumference of the process chamber, the magnets being spaced apart at a predetermined equal distance.

16. The ionized physical vapor deposition apparatus of claim 15, wherein the magnets are permanent magnets.

17. The ionized physical vapor deposition apparatus of claim 1, wherein the process chamber comprises:
    a lower chamber; and
    an upper chamber disposed on the lower chamber,
    wherein the upper chamber is detachable from the lower chamber.

18. The ionized physical vapor deposition apparatus of claim 17, wherein
    the substrate holder is disposed in the lower chamber, and
    the helical self-resonant coil is disposed in the upper chamber.

19. The ionized physical vapor deposition apparatus of claim 1, wherein the deposition material source comprises:
    a cathode assembly that includes a target holder disposed on the process chamber, a target formed of the deposition material attached on the front face of the target holder facing the substrate holder, and a magnet pack disposed on the back side of the target holder; and a cathode power source that applies a negative potential to the target connected to the cathode assembly.

20. The ionized physical vapor deposition apparatus of claim 19, wherein the cathode power source is a DC power source.

21. The ionized physical vapor deposition apparatus of claim 20, wherein the DC power source is electrically connected to the cathode assembly through an RF filter.

22. A ionized physical vapor deposition apparatus, comprising:
 a process chamber that includes a lower chamber and an upper chamber mounted on the lower chamber;
 a substrate holder that supports a substrate to be processed, disposed in the lower chamber;
 a cathode assembly that includes:
  a target holder disposed on the upper chamber;
  a target that provides a deposition material to be deposited on the substrate, attached on the front face of the target holder facing the substrate holder; and
  a magnet pack disposed on the back side of the target holder;
 a cathode power source that applies a negative potential to the target connected to the cathode assembly;
 a gas injection unit to inject process gas into the process chamber;
 a bias power source to apply a bias potential to the substrate holder;
 a helical self-resonant coil that produces plasma for ionization of the deposition material in the process chamber, one end of the helical self-resonant coil being grounded and the other end being electrically open; and
 an RF generator to supply an RF power to the helical self-resonant coil, wherein the RF generator comprises:
  a DC power source; and
  a resonance amplifier,
  wherein the DC power source applies a trigger pulse to the resonance amplifier, and the resonance amplifier amplifies the trigger pulse and outputs it to the helical self-resonant coil.

23. The apparatus of claim 22 further comprising:
 a first tap to be applied an output from the resonance amplifier is disposed on an arbitrary point of the helical self-resonant coil; and
 a second tap to positively feed back of a portion of the output from the resonance amplifier to the resonance amplifier is formed between the first tap and the grounded end.

24. The apparatus of claim 22, wherein the helical self-resonant coil is wound with a uniform diameter.

25. The apparatus of claim 22, wherein the helical self-resonant coil is formed in a conic configuration, a diameter of the helical self-resonant coil gradually increases toward the substrate holder.

26. The apparatus of claim 22, wherein an ignition electrode having a ring shape is connected to the opened end of the helical self-resonant coil and is disposed in the upper chamber.

27. The apparatus of claim 26, wherein a floating shield to prevent discharge between the ignition electrode and the lower chamber is disposed in the lower chamber.

28. The apparatus of claim 22, wherein the gas injection unit comprises:
 a gas source; and
 a ring shaped gas injector that has a plurality of gas distributing holes opened toward the inside of the upper chamber, and disposed on the upper chamber.

29. The apparatus of claim 22 further comprising a faraday shield that controls an electromagnetic energy coupled to the plasma disposed inside of the helical self-resonant coil.

30. The apparatus of claim 29, wherein the faraday shield comprises an inner shield that surrounds the space for producing plasma, the inner shield in which a plurality of inner slots are formed, and an outer shield that surrounds the inner shield, the outer shield in which a plurality of outer slots are formed, wherein the inner slots and the outer slots are disposed to cross each other.

31. The apparatus of claim 22 further comprising a plurality of magnets disposed along the outer circumference of the upper chamber, the magnets being spaced apart at a predetermined distance.

32. The apparatus of claim 22, wherein the cathode power source is a DC power source.

33. The apparatus of claim 32, wherein the DC power source is electrically connected to the cathode assembly through an RF filter.

34. An ionized physical vapor deposition apparatus, comprising:
 a process chamber having a substrate holder that supports a substrate to be processed;
 a deposition material source that supplies a material to be deposited on the substrate into the process chamber facing the substrate holder;
 a gas injection unit to inject a process gas into the process chamber;
 a bias power source that applies a bias potential to the substrate holder;
 a plasma generator that generates plasma for ionizing the deposition material in the process chamber; and
 a faraday shield to control electromagnetic energy coupled to the plasma disposed inside of the helical self-resonant coil,
  wherein the faraday shield comprises an inner shield that surrounds the space for producing plasma, the inner shield in which a plurality of inner slots are formed, and an outer shield that surrounds the inner shield, the outer shield in which a plurality of outer slots are formed, wherein the inner slots and the outer slots are disposed to cross each other, and
 an RF generator to supply an RF power to the helical self-resonant coil, wherein the RF generator comprises:
  a DC power source; and
  a resonance amplifier,
  wherein the DC power source applies a trigger pulse to the resonance amplifier, and the resonance amplifier amplifies the trigger pulse and outputs it to the helical self-resonant coil.

* * * * *